United States Patent
Ye

(10) Patent No.: US 10,852,869 B2
(45) Date of Patent: Dec. 1, 2020

(54) NARROW BORDER TOUCH DISPLAY APPARATUS

(71) Applicant: WUHAN CHINA STAR OPTOELECTRONICS SEMICONDUCTOR DISPLAY TECHNOLOGY CO., LTD., Hubei (CN)

(72) Inventor: Jian Ye, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/477,209

(22) PCT Filed: Apr. 10, 2019

(86) PCT No.: PCT/CN2019/082087
§ 371 (c)(1),
(2) Date: Jul. 11, 2019

(87) PCT Pub. No.: WO2020/118982
PCT Pub. Date: Jun. 18, 2020

(65) Prior Publication Data
US 2020/0192511 A1    Jun. 18, 2020

(51) Int. Cl.
*G06F 3/041*    (2006.01)
*G06F 3/047*    (2006.01)
(Continued)

(52) U.S. Cl.
CPC .......... *G06F 3/0412* (2013.01); *G06F 1/1652* (2013.01); *G06F 3/047* (2013.01);
(Continued)

(58) Field of Classification Search
CPC ........ G06F 2203/00–04809; G06F 3/041–047; G06F 1/1652; G06F 2203/04102; G06F 3/0412
See application file for complete search history.

(56) References Cited

U.S. PATENT DOCUMENTS

2013/0234738 A1   9/2013   Herman
2016/0054846 A1*  2/2016   Lee ..................... G06F 3/0418
                                                              345/174
(Continued)

FOREIGN PATENT DOCUMENTS

CN    201402456 Y    2/2010
CN    102591541 A    7/2012
(Continued)

*Primary Examiner* — Sanjiv D. Patel
(74) *Attorney, Agent, or Firm* — Mark M. Friedman

(57) ABSTRACT

A narrow border touch display apparatus is provided and includes a display layer and a self-capacitive touch-sensing layer. The self-capacitive touch-sensing layer is disposed on a surface of the display layer and includes a touch-sensing area and a wiring area adjacent to the touch-sensing area. The touch-sensing area is provided with a plurality of touch-sensing electrodes arranged in a matrix. Each of the touch-sensing electrodes is connected to a lead. The leads extend to the wiring area. A portion of the self-capacitive touch-sensing layer that is located within the wiring area extends over an edge of the display layer and is mounted on another surface of the display layer by bending.

6 Claims, 5 Drawing Sheets

(51) Int. Cl.
*G06F 3/044* (2006.01)
*H01L 27/32* (2006.01)
*G06F 1/16* (2006.01)

(52) U.S. Cl.
CPC .......... *G06F 3/0443* (2019.05); *G06F 3/0446* (2019.05); *H01L 27/323* (2013.01); *G06F 2203/04102* (2013.01); *G06F 2203/04103* (2013.01); *G06F 2203/04112* (2013.01)

(56) References Cited

U.S. PATENT DOCUMENTS

| | | |
|---|---|---|
| 2017/0010714 A1 | 1/2017 | Lee |
| 2017/0090661 A1* | 3/2017 | Kim ...................... G06F 3/0412 |
| 2017/0277310 A1* | 9/2017 | Xiong .................... H05K 1/028 |
| 2018/0151627 A1* | 5/2018 | Seo ......................... G06F 3/044 |
| 2019/0332200 A1* | 10/2019 | Lee ..................... G06F 3/04164 |

FOREIGN PATENT DOCUMENTS

| | | |
|---|---|---|
| CN | 103226413 A | 7/2013 |
| CN | 103309500 A | 9/2013 |
| CN | 103513830 A | 1/2014 |
| CN | 104199570 A | 12/2014 |
| CN | 106339139 A | 1/2017 |
| CN | 107315498 A | 11/2017 |

\* cited by examiner

NARROW BORDER TOUCH DISPLAY APPARATUS

FIELD OF THE DISCLOSURE

The present application relates to the technical field of display, and in particular to a narrow border touch display apparatus.

DESCRIPTION OF THE RELATED ART

As full-screen mobile phones are increasingly favored by consumers, the demand for mobile touch display modules with a higher screen-to-body ratio is also increasing, and therefore the borders of touch screens and display screens are also required to be narrower.

Traditional touch screens for smart phones are manufactured based on mutual capacitance sensing. The structure thereof usually includes driving electrodes, sensing electrodes, metal leads, and bridging members, wherein the driving electrodes are disposed in a plurality of rows (or columns), and the sensing electrodes are disposed in a plurality of columns (or rows), and the driving electrodes in the same row (or in the same column) would be connected via the bridging members so as to avoid contact with the sensing electrodes. Each row of the driving electrodes and each column of the sensing electrodes are connected to a metal lead, and all of the metal leads extend and connect with a plurality of bonding pins positioned near a bottom frame of the touch screen. Eventually, the bonding pins are bonded to a flexible circuit board using anisotropic conductive adhesive.

However, since the foregoing touch screen manufactured based on mutual capacitance sensing requires forming a plurality of bridging members, it will need to perform multiple mask processes which leads to a more complicated manufacturing process and higher cost.

Hence, it is necessary to provide a narrow border touch display apparatus to overcome the problems existing in the conventional technology.

SUMMARY OF THE TECHNICAL SOLUTION

In view of the shortcomings of the conventional technology, a main objective of the present disclosure is to provide a narrow border touch display apparatus that can be manufactured with a simpler process and lower cost, and a non-display area at its bottom border can be effectively reduced to provide a higher screen-to-body ratio.

In order to achieve the foregoing objective, the present disclosure provides a narrow border touch display apparatus including: a display layer having a first surface and a second surface opposite to each other; a self-capacitive touch-sensing layer disposed on the first surface of the display layer and includes a touch-sensing area and a wiring area adjacent to the touch-sensing area; wherein the touch-sensing area is provided with a plurality of touch-sensing electrodes arranged in a matrix; each of the touch-sensing electrodes is connected to a lead; the leads extend to the wiring area; wherein a portion of the self-capacitive touch-sensing layer that is located within the wiring area extends over an edge of the display layer and is mounted on the second surface of the display layer by bending; and a flexible printed circuit board mounted on the wiring area of the self-capacitive touch-sensing layer and connected to the leads.

In one embodiment of the present disclosure, each of the touch-sensing electrodes is jagged-shaped.

In one embodiment of the present disclosure, the plurality of touch-sensing electrodes are divided into a plurality of columns; in each column of the touch-sensing electrodes, every three touch-sensing electrodes form a Y-axis sensing group; each of the Y-axis sensing groups includes a first touch-sensing electrode, a second touch-sensing electrode, and a third touch-sensing electrode; wherein the first touch-sensing electrode has a plurality of downward jag portions, the second touch-sensing electrode has a plurality of upward jag portions, and the third touch-sensing electrode is positioned between the first touch-sensing electrode and the second touch-sensing electrode and has a plurality of upward jag portions and a plurality of downward jag portions; wherein the upward jag portions of the third touch-sensing electrode face the first touch-sensing electrode and correspond to the downward jag portions of the first touch-sensing electrode in shape; the downward jag portions of the third touch-sensing electrode face the second touch-sensing electrode and correspond to the upward jag portions of the second touch-sensing electrode in shape.

In one embodiment of the present disclosure, the narrow border touch display apparatus further comprises a polarizer mounted on the self-capacitive touch-sensing layer.

In one embodiment of the present disclosure, the touch-sensing electrodes and leads are formed of transparent conductive material.

In one embodiment of the present disclosure, the transparent conductive material is indium tin oxide.

In one embodiment of the present disclosure, the display layer is an organic light-emitting diode display panel.

In one embodiment of the present disclosure, the display layer is a flexible display panel.

The present disclosure further provides another narrow border touch display apparatus including: a display layer having a first surface and a second surface opposite to each other; and a self-capacitive touch-sensing layer disposed on the first surface of the display layer and includes a touch-sensing area and a wiring area adjacent to the touch-sensing area; wherein the touch-sensing area is provided with a plurality of touch-sensing electrodes; each of the touch-sensing electrodes is connected to a lead; the leads extend to the wiring area; wherein a portion of the self-capacitive touch-sensing layer that is located within the wiring area extends over an edge of the display layer and is mounted on the second surface of the display layer by bending.

In one embodiment of the present disclosure, the touch-sensing electrodes are arranged in a matrix.

In one embodiment of the present disclosure, the narrow border touch display apparatus further includes a flexible printed circuit board mounted on the wiring area of the self-capacitive touch-sensing layer and connected to the leads.

In one embodiment of the present disclosure, each of the touch-sensing electrodes is jagged-shaped.

In one embodiment of the present disclosure, the plurality of touch-sensing electrodes are divided into a plurality of columns; in each column of the touch-sensing electrodes, every three touch-sensing electrodes form a Y-axis sensing group; each of the Y-axis sensing groups includes a first touch-sensing electrode, a second touch-sensing electrode, and a third touch-sensing electrode; wherein the first touch-sensing electrode has a plurality of downward jag portions, the second touch-sensing electrode has a plurality of upward jag portions, and the third touch-sensing electrode is positioned between the first touch-sensing electrode and the second touch-sensing electrode and has a plurality of upward jag portions and a plurality of downward jag portions; wherein the upward jag portions of the third touch-sensing electrode face the first touch-sensing electrode and correspond to the downward jag portions of the first touch-sensing electrode in shape; the downward jag portions of the third touch-sensing electrode face the second touch-sensing electrode and correspond to the upward jag portions of the second touch-sensing electrode in shape.

In one embodiment of the present disclosure, the narrow border touch display apparatus further comprises a polarizer mounted on the self-capacitive touch-sensing layer.

In one embodiment of the present disclosure, the touch-sensing electrodes and leads are formed of transparent conductive material.

In one embodiment of the present disclosure, the transparent conductive material is indium tin oxide.

In one embodiment of the present disclosure, the display layer is an organic light-emitting diode display panel.

In one embodiment of the present disclosure, the display layer is a flexible display panel.

The present disclosure mainly disposes a self-capacitive touch-sensing layer on a display layer and make the leads of the touch-sensing electrodes of the self-capacitive touch-sensing layer to extend to an adjacent wiring area, and makes a portion of the self-capacitive touch-sensing layer that is located within the wiring area to extend over an edge of the display layer and be mounted on a back surface of the display layer by bending. The touch-sensing electrodes and leads of the self-capacitive touch-sensing layer do not require extra bridging members and only take one mask process to form. Thus, the narrow border touch display apparatus can be manufactured with a simpler process and lower cost, and a non-display area at its bottom border can be effectively reduced to provide a higher screen-to-body ratio.

DETAILED DESCRIPTION OF THE PREFERRED EMBODIMENTS

The following description of the embodiments is used for illustrating particular embodiments to be implemented in the present invention. The directional terms as used here, such as "upper", "lower", "front", "rear", "left", "right", "inner", "outer" and "side", merely refer to the directions shown in the accompanying drawings. Therefore, the used directional terms are used for describing and understanding the present invention, rather than limiting the present invention.

Figure 1:
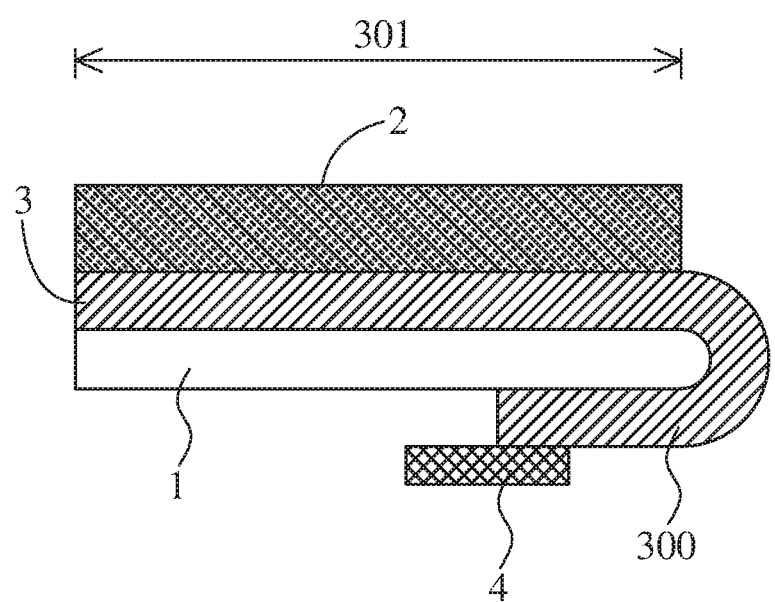
FIG. 1 is a cross-sectional view of a narrow border touch display apparatus according to an embodiment of the present disclosure.
Figure 2:
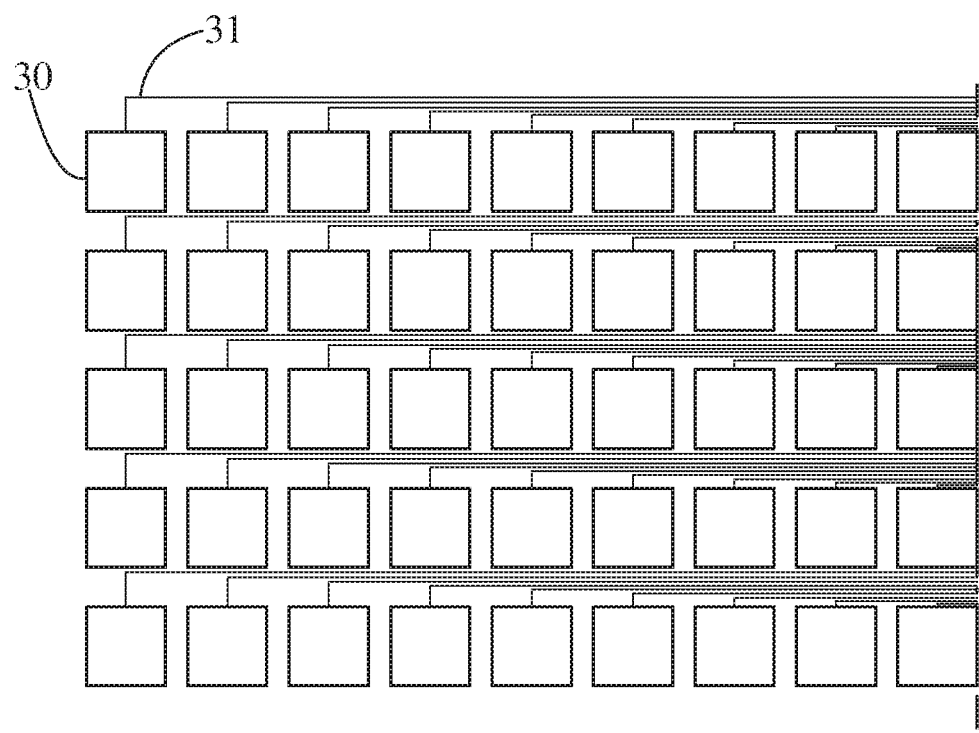
FIG. 2 is a plane view of a narrow border touch display apparatus according to an embodiment of the present disclosure.
Figure 3:
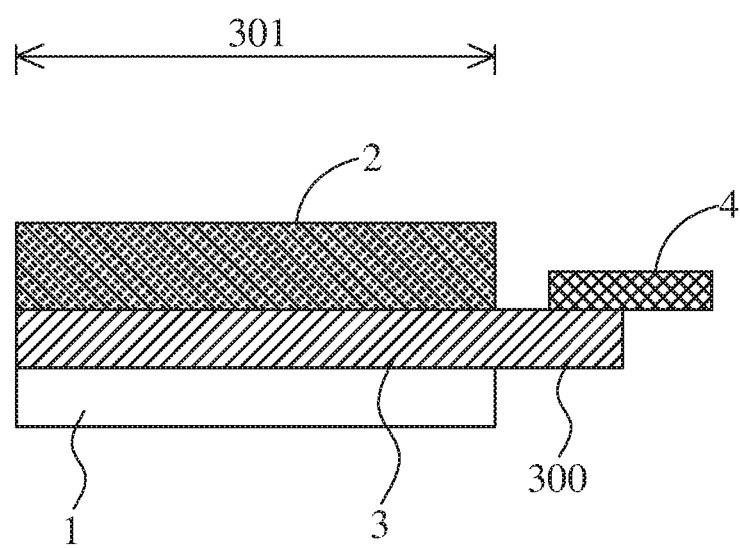
FIG. 3 is a cross-sectional view of a narrow border touch display apparatus before performing a bending technique according to an embodiment of the present disclosure.
Figure 4:
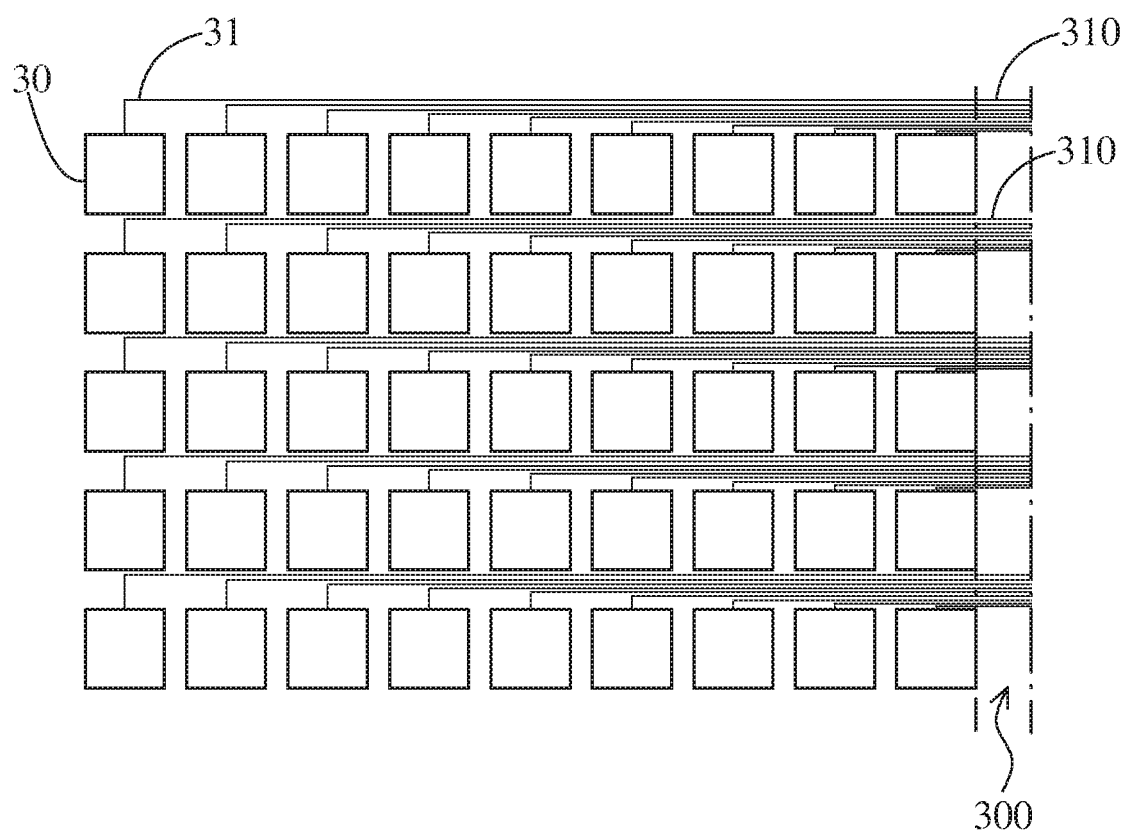
FIG. 4 is a plane view of the narrow border touch display apparatus before performing the bending technique according to an embodiment of the present disclosure.

With reference to FIG. 1 to FIG. 4, FIG. 1 is a cross-sectional view of a narrow border touch display apparatus according to an embodiment of the present disclosure; FIG. 2 is a plane view of the narrow border touch display apparatus according to an embodiment of the present disclosure; FIG. 3 is a cross-sectional view of the narrow border touch display apparatus before performing a bending technique according to an embodiment of the present disclosure. FIG. 4 is a plane view of the narrow border touch display apparatus before performing the bending technique according to an embodiment of the present disclosure. The narrow border touch display apparatus mainly includes a display layer 1 and a self-capacitive touch-sensing layer 3.

The display layer 1 may be a flexible display panel. For example, it may be an organic light-emitting diode display panel which includes a plurality of organic light-emitting diode members. The display layer 1 has a first surface and a second surface opposite to each other.

As shown in FIG. 1 and FIG. 3, the self-capacitive touch-sensing layer 3 is disposed on the first surface of the display layer 1 and includes a touch-sensing area 301 and a wiring area 300 adjacent to the touch-sensing area 301. The touch-sensing area 301 is provided with a plurality of touch-sensing electrodes 30, and each of the touch-sensing electrodes 30 is connected to a lead 31. An end 310 of each of the leads 31 extends to the wiring area 300. As shown in FIG. 1, a portion of the self-capacitive touch-sensing layer 3 that is located within the wiring area 300 extends over an edge of the display layer 1 and is mounted on the second surface of the display layer 1 by bending; thereby, the ends 310 of the leads 31 are opposite to the touch-sensing electrodes 30.

With reference to FIG. 2 and FIG. 4, the plurality of touch-sensing electrodes 30 are preferably arranged in a matrix and may be divided into a plurality of columns and a plurality of rows. In one embodiment, the leads 31 to which each column of the touch-sensing electrodes are connected extend together to the wiring area 300 from the same side. In one embodiment, the touch-sensing electrodes 30 and the leads 31 are formed of transparent conductive material; for example, the transparent conductive material may be indium tin oxide. In one embodiment, each of the touch-sensing electrodes 30 may be square-shaped.

In the structure of the self-capacitive touch-sensing layer 3, the touch-sensing electrodes 30 are disposed on the same layer and each connects to a lead 31. Therefore, only one mask process is needed to complete the manufacture of the touch-sensing electrodes 30 and the leads 31, and no additional bridging structures are required. Thus, the manufacture process of the narrow border touch display apparatus is much simpler and costs lower.

Furthermore, compared with the traditional touch screens that are manufactured based on mutual capacitance sensing, the self-capacitive touch-sensing layer 3 has more leads disposed within the wiring area 300 and occupy the space for effective touch-sensing, thereby causing relatively lower touch sensitivity in this area and making the area a touch-sensing blind zone for a touch display apparatus. Therefore, the present disclose uses the foregoing bending technique to bend the portion of the self-capacitive touch-sensing layer 3 that is located within the wiring area 300 and extending over the edge of the display layer 1 so that the portion is mounted on a back surface of the display layer 1, thereby ensuring that the self-capacitive touch-sensing layer 3 provides a fully effective touch sensing area on the display layer 1 and a screen-to-body ratio for touch sensing is effectively increased.

As shown in FIG. 1 and FIG. 3, the narrow border touch display apparatus further includes at least one polarizer 2 and a flexible printed circuit board 4. The at least one polarizer 2 may be mounted on the self-capacitive touch-sensing layer and correspondingly cover the touch-sensing area 301 and a display area of the display layer 1. The flexible printed circuit board 4 may be mounted on the wiring area 300 of the self-capacitive touch-sensing layer 3 and connected to the leads 31. The flexible printed circuit board 4 may be provided with a touch-sensing chip or connected to an external touch-sensing circuit so that the flexible printed circuit board 4 can transmit a touch signal that is sensed from the flexible printed circuit board 4 to the touch-sensing chip to determine a touch position based on the touch signal.

In another embodiment, each of the touch-sensing electrodes 30 may be jagged-shaped to increase touch-sensing accuracy.

Figure 5:
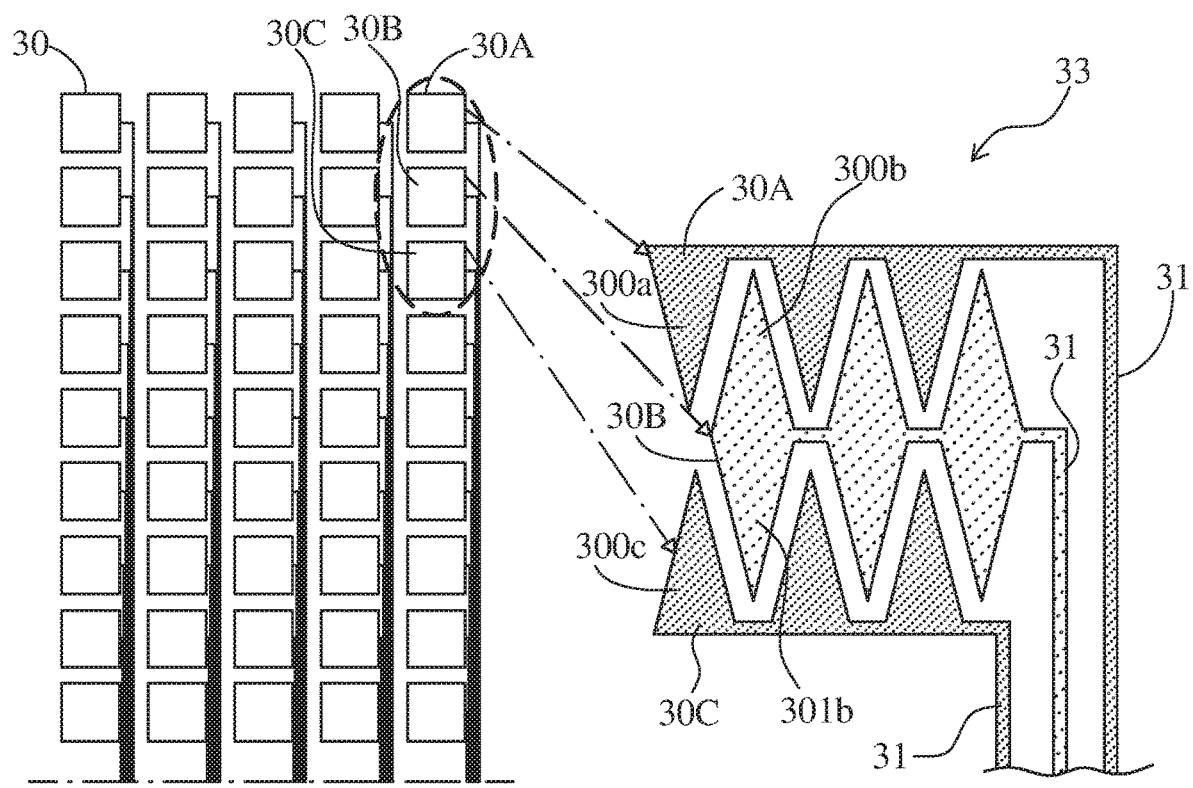
FIG. 5 is a partially enlarged view of touch-sensing electrodes of a narrow border touch display apparatus according to an embodiment of the present disclosure.

For example, with further reference to FIG. 5, in a preferred embodiment, the plurality of touch-sensing electrodes are divided into a plurality of columns; in each column of the touch-sensing electrodes, every three touch-sensing electrodes form a Y-axis sensing group 33. Specifically, each of the Y-axis sensing groups 33 includes a first touch-sensing electrode 30A, a second touch-sensing electrode 30C, and a third touch-sensing electrode 30B that are arranged at intervals. The first touch-sensing electrode 30A has a plurality of downward jag portions 300*a*. The second touch-sensing electrode 30C has a plurality of upward jag portions 300*c*. The third touch-sensing electrode 30B is positioned between the first touch-sensing electrode 30A and the second touch-sensing electrode 30C and has a plurality of upward jag portions 300*b* and a plurality of downward jag portions 301*b*. It is worth noticed that, as shown in FIG. 5, the upward jag portions 300*b* of the third touch-sensing electrode 30B face the first touch-sensing electrode 30A and correspond to the downward jag portions 300*a* of the first touch-sensing electrode 30A in shape; the downward jag portions 301*b* of the third touch-sensing electrode 30B face the second touch-sensing electrode 30C and correspond to the upward jag portions 300*c* of the second touch-sensing electrode 30C in shape. With the Y-axis sensing groups 33 formed by the touch-sensing electrodes, space occupied by the touch-sensing electrodes 30 along a column direction can be reduced so that more of the touch-sensing electrodes 30 can be arranged along the column direction in the narrow border touch display apparatus.

With the touch-sensing structure of the Y-axis sensing groups 33, a sensing area between a user's finger and the jagged-shaped touch-sensing electrodes would constantly change, therefore a y-coordinate position of the finger can be calculated through a proportion of the sensing area (sensitivity), thereby improving the touch accuracy of y-coordinate.

In conclusion, compared with the conventional technology, the present disclosure mainly disposes a self-capacitive touch-sensing layer on a display layer and make the leads of the touch-sensing electrodes of the self-capacitive touch-sensing layer to extend to an adjacent wiring area, and makes a portion of the self-capacitive touch-sensing layer that is located within the wiring area to extend over an edge of the display layer and be mounted on a back surface of the display layer by bending. The touch-sensing electrodes and leads of the self-capacitive touch-sensing layer do not require extra bridging members and only take one mask process to form. Thus, the narrow border touch display apparatus can be manufactured with a simpler process and lower cost, and a non-display area at its bottom border can be effectively reduced to provide a higher screen-to-body ratio.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A narrow border touch display apparatus, comprising:
   a display layer having a first surface and a second surface opposite to each other;
   a self-capacitive touch-sensing layer disposed on the first surface of the display layer and includes a touch-sensing area and a wiring area adjacent to the touch-sensing area; wherein the touch-sensing area is provided with a plurality of touch-sensing electrodes arranged in a matrix; each of the touch-sensing electrodes is connected to a lead; the leads extend to the wiring area,
   wherein each of the touch-sensing electrodes is jagged-shaped; the plurality of touch-sensing electrodes are divided into a plurality of columns; in each column of the touch-sensing electrodes, every three touch-sensing electrodes form a Y-axis sensing group; and each of the Y-axis sensing groups includes a first touch-sensing electrode, a second touch-sensing electrode, and a third touch-sensing electrode;
   wherein the first touch-sensing electrode has a first flat bottom and a plurality of downward jag portions extending downward from the first flat bottom; the second touch-sensing electrode has a second flat bottom and a plurality of upward jag portions extending upward from the second flat bottom; and the third touch-sensing electrode is positioned between the first touch-sensing electrode and the second touch-sensing electrode and has a plurality of upward jag portions and a plurality of downward jag portions;
   wherein the upward jag portions of the third touch-sensing electrode face the first touch-sensing electrode and correspond to the downward jag portions of the first touch-sensing electrode in shape; the downward jag portions of the third touch-sensing electrode face the second touch-sensing electrode and correspond to the upward jag portions of the second touch-sensing electrode in shape; and
   and a portion of the self-capacitive touch-sensing layer that is located within the wiring area extends over an edge of the display layer and is mounted on the second surface of the display layer by bending; and
   a flexible printed circuit board mounted on the wiring area of the self-capacitive touch-sensing layer and connected to the leads.

2. The narrow border touch display apparatus according to claim 1, wherein the narrow border touch display apparatus further comprises a polarizer mounted on the self-capacitive touch-sensing layer.

3. The narrow border touch display apparatus according to claim 1, wherein the touch-sensing electrodes and leads are formed of transparent conductive material.

4. The narrow border touch display apparatus according to claim 3, wherein the transparent conductive material is indium tin oxide.

5. The narrow border touch display apparatus according to claim 1, wherein the display layer is an organic light-emitting diode display panel.

6. The narrow border touch display apparatus according to claim 1, wherein the display layer is a flexible display panel.

\* \* \* \* \*

UNITED STATES PATENT AND TRADEMARK OFFICE
CERTIFICATE OF CORRECTION

PATENT NO.         : 10,852,869 B2                                        Page 1 of 1
APPLICATION NO.    : 16/477209
DATED              : December 1, 2020
INVENTOR(S)        : Jian Ye It is certified that error appears in the above-identified patent and that said Letters Patent is hereby corrected as shown below:

On the Title Page

Please insert Item (30):
--(30) Foreign application Priority Data
December 14, 2018 (CN) 201811535509.0--

Signed and Sealed this
Sixteenth Day of February, 2021

Drew Hirshfeld
*Performing the Functions and Duties of the*
*Under Secretary of Commerce for Intellectual Property and*
*Director of the United States Patent and Trademark Office*